(12) United States Patent
Hashimoto (10) Patent No.: US 6,326,233 B1
(45) Date of Patent: *Dec. 4, 2001

(54) SEMICONDUCTOR DEVICE, METHOD OF FABRICATING THE SAME AND ELECTRONIC APPARATUS

(75) Inventor: Nobuaki Hashimoto, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/511,081

(22) Filed: Feb. 23, 2000

Related U.S. Application Data (63) Continuation of application No. 09/220,595, filed on Dec. 28, 1998, now Pat. No. 6,057,174.

(30) Foreign Application Priority Data

Jan. 7, 1998 (JP) .................................... 10-13443

(51) Int. Cl.[7] .......................... H01L 21/44; H01L 21/48; H01L 21/50
(52) U.S. Cl. .......................... 438/106; 438/51; 438/106; 438/108; 438/118; 438/464; 257/706; 257/707
(58) Field of Search .................................... 438/106–108, 438/110–113, 118, 51, 464; 414/271; 257/668, 706–707

(56) References Cited

U.S. PATENT DOCUMENTS

| | | | |
|---|---|---|---|
| 4,283,839 | * 8/1981 | Gursky | 29/589 |
| 4,689,875 | * 9/1987 | Solstad | 437/211 |
| 4,818,726 | * 4/1989 | Flaten | 437/207 |
| 4,980,219 | * 12/1990 | Hiraide et al. | 428/134 |
| 5,023,202 | * 6/1991 | Long et al. | 437/206 |
| 5,427,641 | * 6/1995 | Muramatsu et al. | 156/252 |
| 5,513,792 | * 5/1996 | Onitsuka | 228/180.22 |
| 5,588,614 | * 12/1996 | Takada et al. | 242/538.2 |
| 5,631,497 | 5/1997 | Miyano . | |
| 5,804,872 | 6/1999 | Miyano . | |
| 5,901,041 | * 5/1999 | Davies et al. | 361/704 |
| 5,976,955 | * 11/1999 | Hodges | 438/464 |

FOREIGN PATENT DOCUMENTS

| | | |
|---|---|---|
| 0 526 147 A2 | 2/1993 | (EP) . |
| A 2-12848 | 1/1990 | (JP) . |
| A-2-12848 | 1/1990 | (JP) . |
| A-3-215953 | 9/1991 | (JP) . |

* cited by examiner

*Primary Examiner*—Matthew Smith
*Assistant Examiner*—Granvill D Lee, Jr.
(74) *Attorney, Agent, or Firm*—Oliff & Berridge, PLC (57) ABSTRACT

Method of fabricating semiconductor devices comprising the steps of: mounting a plurality of semiconductor chips on a film carrier tape; sealing each one of the semiconductor chips mounted on the film carrier tape with epoxy resin; attaching an individual stiffener to the film carrier tape at a position corresponding to each one of the semiconductor chips; forming a plurality of bumps on the film carrier tape at a position corresponding to each one of the semiconductor chips; and punching out the film carrier tape into separate pieces of insulating film after above-described steps. In this method, each step is carried out on the film carrier tape running between supply and take-up reels.

8 Claims, 7 Drawing Sheets

SEMICONDUCTOR DEVICE, METHOD OF FABRICATING THE SAME AND ELECTRONIC APPARATUS

This is a Continuation of application Ser. No. 09/220,595 filed Dec. 28, 1998 now U.S. Pat. No. 6,057,174. The entire disclosure of the prior application is hereby incorporated by reference herein in its entirety.

BACKGROUND OF THE INVENTION

Field of the Invention

The present invention relates to a semiconductor device, a method of fabricating the same, and an electronic apparatus.

Description of the Related Art

In the microminiaturization of semiconductor devices, a bare chip mounting arrangement is regarded as an ideal form of assembly. However, since quality assurance and the handling of a bare chip are difficult, the chip is assembled in a package during semiconductor device fabrication. As one of the package forms meeting the need for high pin counts, a ball grid array (BGA) type package has been developed recently. On a substrate of the BGA type package, external terminal bumps are arranged in an area array to permit surface mounting.

As one kind of BGA type package, there is a tape ball grid array (T-BGA) package in which a film carrier tape is used as a base in fabrication with a tape automated bonding (TAB) technique. In T-BGA packaging using the TAB technique, semiconductor chips can be assembled continuously.

Since the film carrier tape is liable to warp due to lack of rigidity, however, it is required to attach a reinforcing sheet (stiffener). In a process of semiconductor device fabrication, the stiffener is attached to an individual film package punched out after each semiconductor chip is mounted on the film carrier tape. More particularly, the film carrier tape is punched out into separate film packages, and then the stiffener is individually attached.

In this method, after the stiffener has been attached as mentioned above, the film packages must be handled individually in subsequent processes such as bump formation, resulting in trouble in fabrication.

It is therefore an object of the present invention to obviate the above-mentioned drawback by providing a method of fabricating T-BGA packages which are easy to handle, a semiconductor device fabricated by this method, and an electronic apparatus.

SUMMARY OF THE INVENTION (1) According to a first aspect of the present invention, there is provided a method of fabricating semiconductor devices comprising the steps of: mounting a plurality of semiconductor chips on a film carrier tape; sealing each one of the semiconductor chips mounted on the film carrier tape with a resin; attaching an individual reinforcing member to the film carrier tape at a position corresponding to each one of the semiconductor chips; forming a plurality of external electrodes on the film carrier tape at a position corresponding to each one of the semiconductor chips; and punching out the film carrier tape into separate film packages after above-described steps; wherein each of the steps is carried out on the film carrier tape running between supply and take-up reels.

In this method, the reinforcing member represents any part serving to prevent the film carrier tape from warping (for ensuring planarity). As such a reinforcing member, a so-called stiffener is used in most cases of semiconductor device fabrication.

In this method of the present invention, not only the semiconductor chip mounting step and the resin sealing step, but also the reinforcing member attaching step and the external electrode forming step can be carried out in a continuous reel-to-reel fashion, thereby increasing productivity and reducing manufacturing cost.

(2) The method of the present invention may further comprise a step of bonding a heat spreading member to each one of the semiconductor chips before the step of punching out the film carrier tape.

With this method, since the step of bonding the heat spreading member is also performed before the film carrier tape is punched out, continuous and efficient fabrication can be accomplished. The heat spreading member is used for efficiently dissipating heat from the semiconductor chip and bonded to the semiconductor chip depending on the amount of heat to be produced.

(3) According to a second aspect of the present invention, there is provided a semiconductor device fabricated by using the above-described method.

(4) According to a third aspect of the present invention, there is provided a circuit board comprising the above-described semiconductor device.

(5) According to a fourth aspect of the present invention, there is provided an electronic apparatus including the above-described circuit board.

DESCRIPTION OF PREFERRED EMBODIMENT

Embodiments of the present invention will now be described below with reference to the accompanying drawings.

Figure 6A:
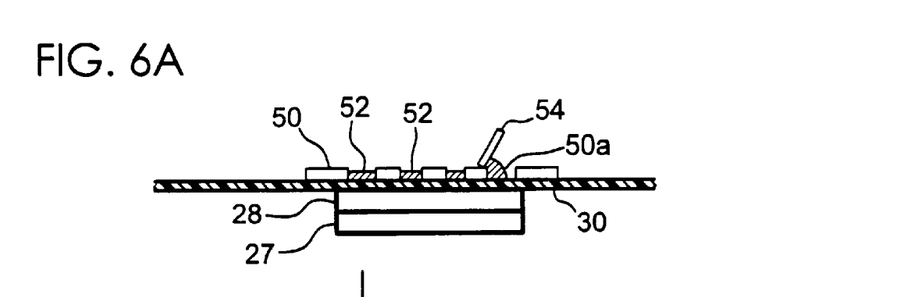
FIGS. 6A to 6C are diagrams illustrating a bump forming process in the embodiment of the semiconductor device fabrication method according to the present invention.
Figure 6B:
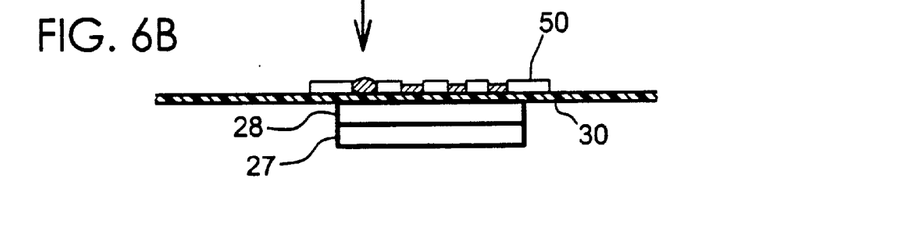
Figure 6C:
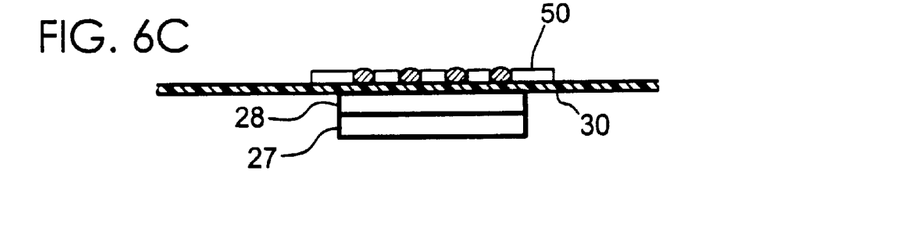
Figure 7:
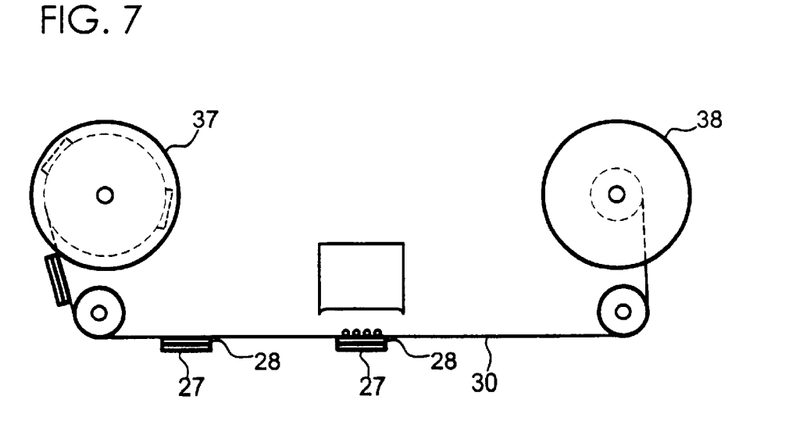
FIG. 7 is a diagram illustrating a tape punching-out process in the embodiment of the semiconductor device fabrication method according to the present invention.
Figure 8:
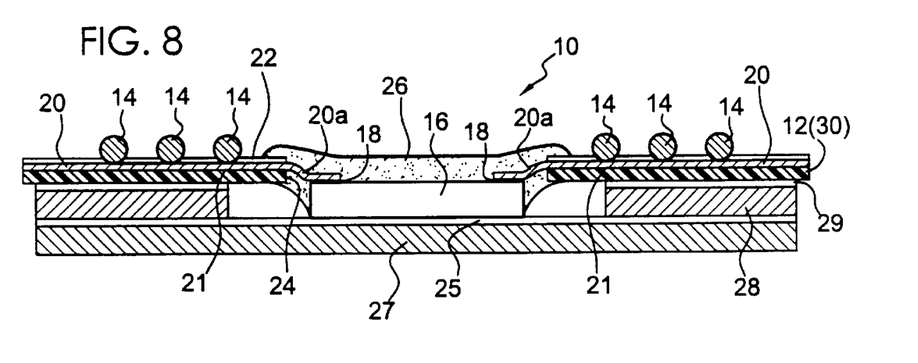
FIG. 8 is a diagram showing the embodiment of the semiconductor device according to the present invention.

FIGS. 1A through 7 are diagrams illustrating the steps in the embodiment of the semiconductor device fabrication method of the present invention, and FIG. 8 shows the embodiment of a finished semiconductor device according to the present invention.

As shown in FIG. 8, a BGA package is applied to a semiconductor device 10. In this figure, the semiconductor device 10 comprises an insulating film 12, a plurality of leads 20 formed on the insulating film 12, a bump 14 formed on each of the leads 20, and a semiconductor chip 16. The bump 14 is used for an external electrode. Surface mounting can be implemented by using the plurality of bumps 14.

The insulating film 12 is formed by punching out a long film carrier tape 30 (see FIG. 1B), using the TAB technique in a process of fabrication. The insulating film 12 is formed to be larger than the semiconductor chip 16, and a device hole 24 formed on the film carrier tape 30 remains on the insulating film 12.

One end portion 20a of the lead 20 protrudes into the device hole 24, and the end portion 20a is connected to an electrode 18 of the semiconductor chip 16. More particularly, on the side of the insulating film 12 opposite to the mounting side of the lead 20, the semiconductor chip 16 is disposed so that the electrode 18 thereof is positioned inside the device hole 24, and the end portion 20a of the lead 20 is bonded to the electrode 18.

Figure 1A:
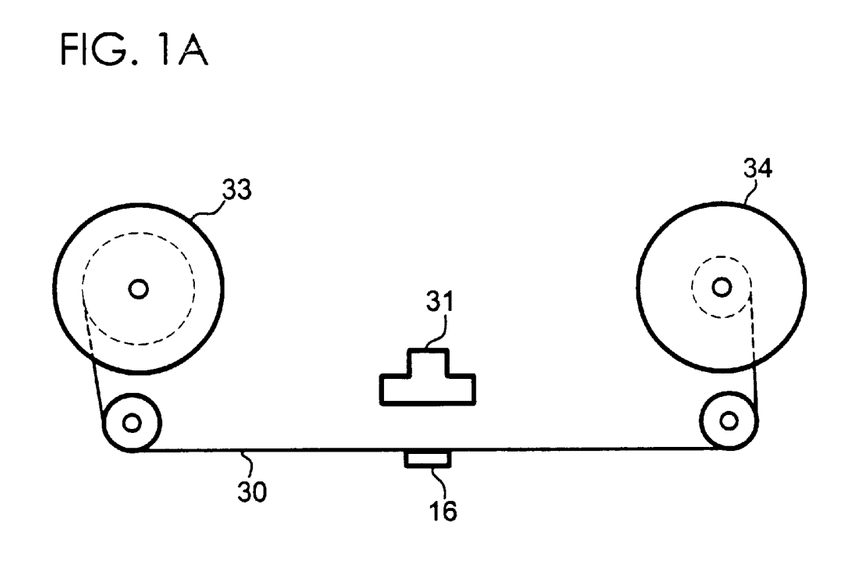
FIGS. 1A and 1B are diagrams illustrating a bonding process in the embodiment of the semiconductor device fabrication method according to the present invention.
Figure 1B:
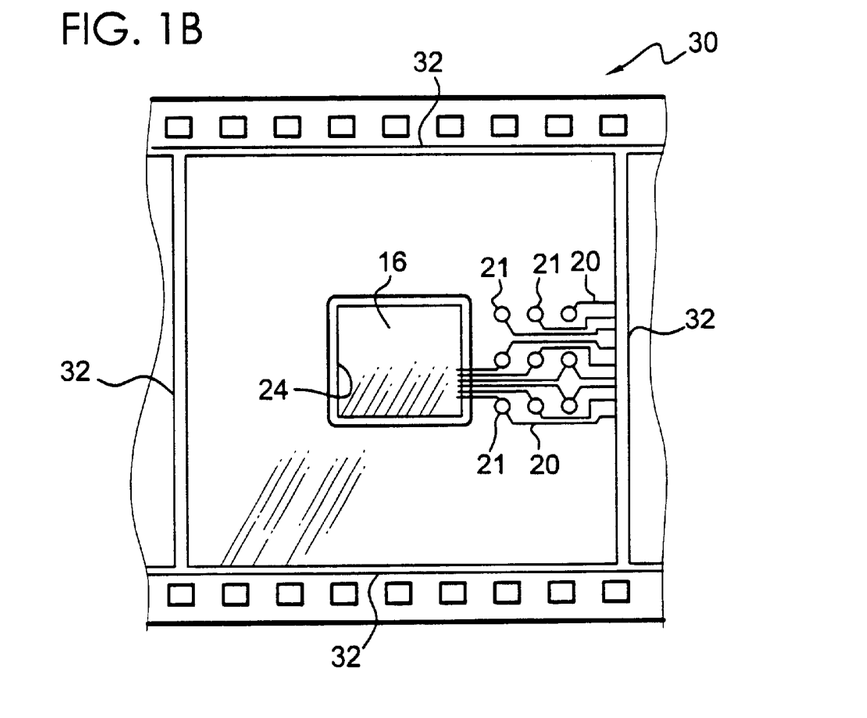

The lead 20 connects the electrode 18 of the semiconductor chip 16 with a land 21 (see FIG. 1B). The land 21 is provided with the bump 14. Each bump 14 is made of a material such as solder, for example, and the tip thereof has a ball-like shape. Copper or the like may be used in lieu of solder as the material for the bump 14.

The solder resist 22 is applied onto the lead 20 side of the insulating film 12, while circumventing the bumps 14. The surface of the lead 20 is thus covered with the solder resist 22 for protection.

A stiffener 28 having a plate-like shape is attached to the insulating film 12 on the side opposite to the bumps 14. The stiffener 28 is made of copper, stainless steel, copper alloy or the like, and is strong enough to maintain a planar configuration. The stiffener 28 is attached to the insulating film 12 by means of an insulating adhesive 29. The insulating adhesive 29 is applied in the form of a thermosetting or thermoplastic film. Circumventing the semiconductor chip 16, the stiffener 28 is attached to the entire surface of the insulating film 12. Thus, the stiffener 28 prevents the insulating film 12 from being distorted or warped. This ensures uniformity in the height of the bumps 14 to improve planarity thereof, leading to enhancement of yield in the mounting of semiconductor devices on circuit boards.

Further, a heat spreader 27 is bonded to the semiconductor chip 16 on the side opposite to the surface-mounted side through a thermally conductive adhesive 25 such as silver paste. Thus, heat from the semiconductor chip 16 can be efficiently dissipated. An ordinary insulating adhesive or the insulating film mentioned above may be used in lieu of the thermally conductive adhesive 25 depending on the amount of heat produced by the semiconductor chip 16. The heat spreader 27 is formed to be larger in size than the semiconductor chip 16 and can be bonded to the stiffener 28. Between the stiffener 28 and the heat spreader 27, the thermally conductive adhesive 25 is provided for bonding them.

The connection portion between the semiconductor chip 16 and the insulating film 12 is sealed by potting of epoxy resin 26. The epoxy resin 26 is applied to the surface of the semiconductor chip 16 where the electrode 18 is formed and also applied to the device hole 24 and the periphery of the semiconductor chip 16.

The embodiment of the semiconductor device of the present invention has a configuration as described above, and the method of fabricating such semiconductor device is now described below.

First, as shown in FIG. 1A, the semiconductor chip 16 is mounted on the film carrier tape 30. FIG. 1B shows an enlarged view of the film carrier tape 30. Note that FIG. 1B indicates the film carrier tape 30 of FIG. 1A as viewed from above.

The film carrier tape 30 is made of material such as polyimide resin. On the film carrier tape 30, a plurality of device holes 24 are formed (one of them is indicated in FIG. 1B), and a plurality of leads 20 and a plurality of lands 21 are arranged outside each device hole 24. Circumventing the lands 21, the solder resist 22 (see FIG. 8) is applied to the side where the leads 20 are formed. In FIG. 1B, just some of the leads 20 and lands 21 are indicated while others are omitted.

The land 21 is connected to a plating lead 32 through a part of the lead 20 extending in a direction away from the device hole 24. All the leads 20, including those not shown in FIG. 1B, are connected to the plating lead 32. Using the plating lead 32, all the leads 20 and lands 21 are electroplated. Alternatively, the leads 20 and lands 21 may be plated by the electroless plating technique. In this case, it is not necessary to provide the plating lead 32.

The film carrier tape 30 mentioned above is wound on a reel 33 as shown in FIG. 1A. The end of the film carrier tape 30 is rolled out, and then rolled up by a take up reel 34. The semiconductor chip 16 is bonded to the film carrier tape 30 between the reels 33 and 34 using a bonding jig 31. For this bonding process, either single-point bonding or gang bonding may be employed. With the gang bonding, the end portions 20a of all the leads 20 can be bonded to the electrodes 18 of each semiconductor chip 16 at a time.

The semiconductor chip 16 is positioned so that it protrudes from the side opposite to the lead-20 forming side of the insulating film 12 as shown in FIG. 8.

A plurality of semiconductor chips 16 are thus mounted on the film carrier tape 30 successively, and then the reel 34 takes up the film carrier tape 30 having the plurality of semiconductor chips 16 mounted thereon.

Figure 2A:
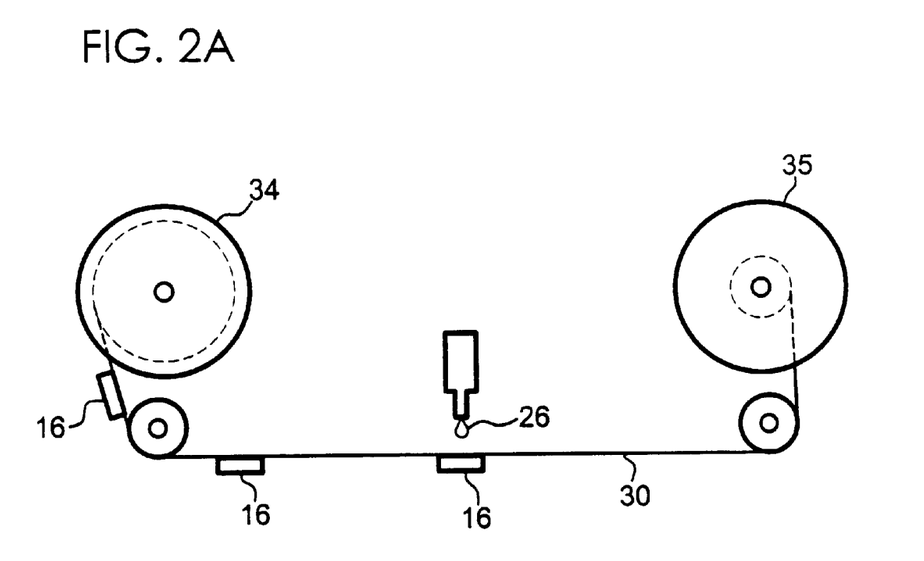
FIGS. 2A and 2B are diagrams illustrating a molding process in the embodiment of the semiconductor device fabrication method according to the present invention.

Then, as shown in FIG. 2A, the reel 34 with the film carrier tape 30 wound thereon is set on another fabrication equipment. The film carrier tape 30 is rolled out and placed between the reels 34 and 35, and the epoxy resin 26 is potted to the film carrier tape 30. Note that FIG. 2B shows a top view of the film carrier tape 30 of FIG. 2A after the epoxy resin 26 has been potted.

Figure 2B:
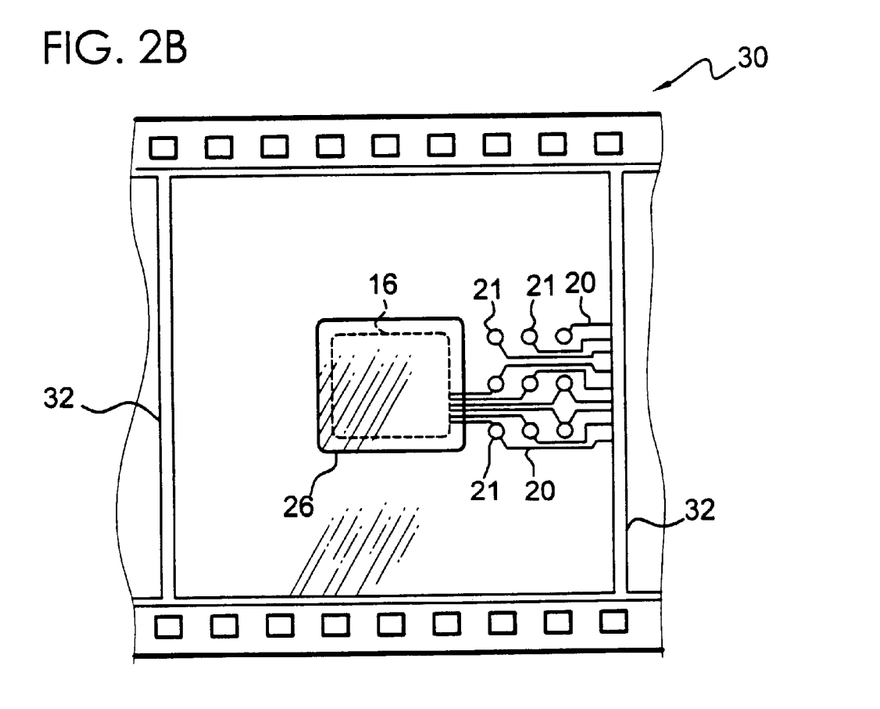

As shown in FIG. 2B, the epoxy resin 26 is applied to the lead 20 side of the film carrier tape 30 so that the semiconductor chip 16 is covered. Further, as shown in FIG. 8, the epoxy resin 26 is also applied to the periphery of the semiconductor chip 16 to seal interstices between the device hole 24 and the semiconductor chip 16 on the film carrier tape 30.

Figure 3A:
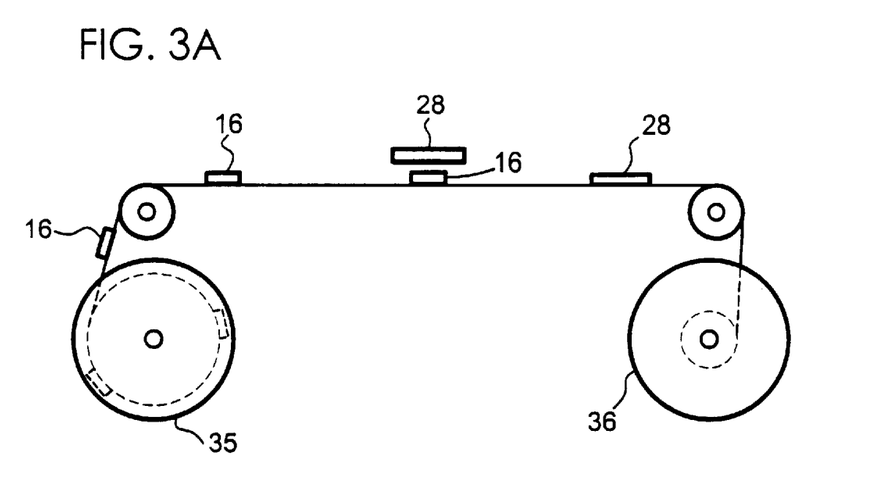
FIGS. 3A and 3B are diagrams illustrating a stiffener attaching process in the embodiment of the semiconductor device fabrication method according to the present invention.
Figure 3B:
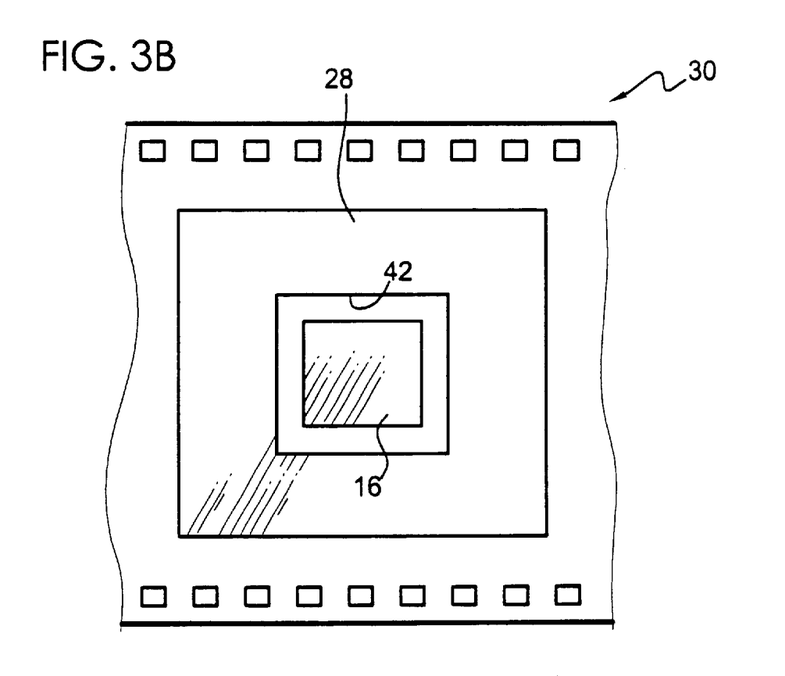

Then, as shown in FIGS. 3A and 3B, the reel 35 having the film carrier tape 30 wound thereon is set on still another fabrication equipment. The film carrier tape 30 is rolled out and placed between the reels 35 and 36, and the stiffener 28 is attached to the film carrier tape 30. Note that FIG. 3B shows a top view of the film carrier tape 30 of FIG. 3A.

Specifically, the stiffener 28 is attached to the film carrier tape 30 on the side where the semiconductor chip 16 protrudes. As shown in FIG. 8, this side of the film carrier tape 30 is opposite to the side where the leads 20 and lands 21 are provided. The stiffener 28 has a device hole 42 that is larger in size than the outline of the semiconductor chip 16. The stiffener 28 is attached so that the semiconductor chip 16 is disposed inside the device hole 42. For each semiconductor chip 16, an individual stiffener 28 is attached.

The stiffener 28 is bonded to the film carrier tape 30 by means of the insulating adhesive 29 as shown in FIG. 8. The insulating adhesive 29 may be prepared in the form of thermosetting or thermoplastic film and previously attached to the stiffener 28. Thus, the stiffener 28 can be thermocompression-bonded to the film carrier tape 30 on the side where the semiconductor chip 16 protrudes.

Figure 4A:
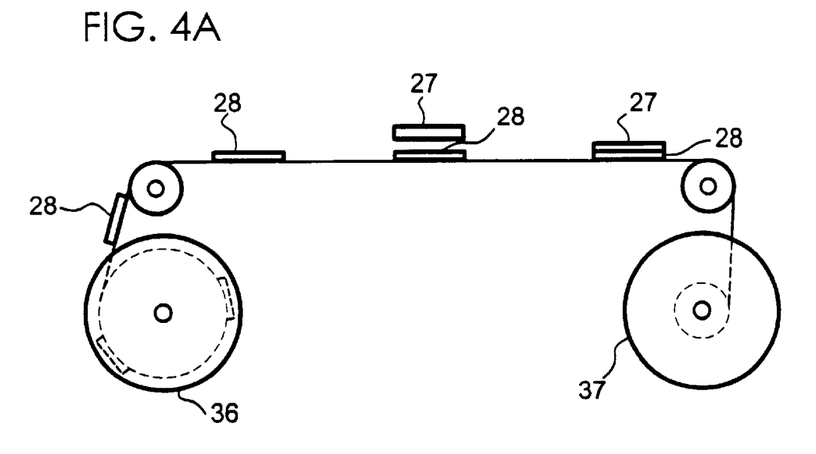
FIGS. 4A and 4B are diagrams illustrating a heat spreader attaching process in the embodiment of the semiconductor device fabrication method according to the present invention.
Figure 4B:
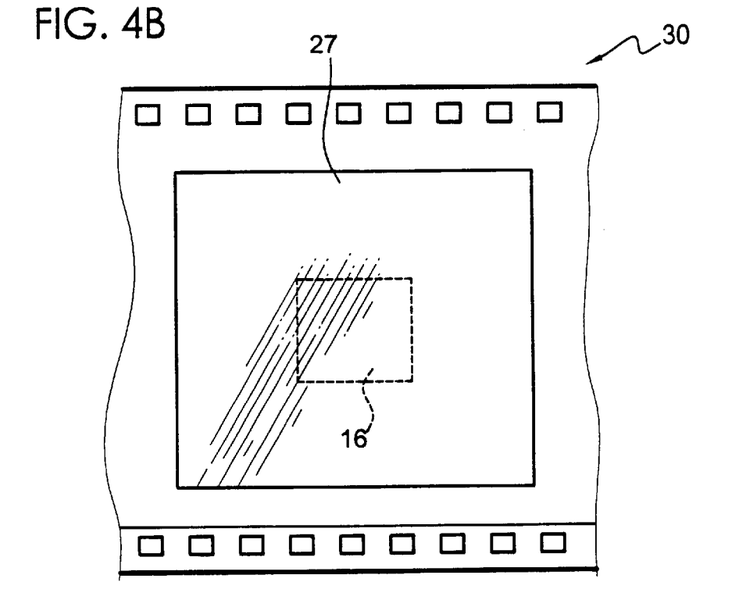

Then, as shown in FIGS. 4A and 4B, the reel 36 having the film carrier tape 30 wound thereon is set on another fabrication equipment. The film carrier tape 30 is rolled out and placed between the reels 36 and 37. The heat spreader 27 is then individually attached to each semiconductor chip 16. More specifically, as shown in FIG. 8, the heat spreader 27 is bonded to the semiconductor chip 16 on the side opposite to the electrodes 18 so that the stiffener 28 is covered therewith. For this bonding, the thermally conductive adhesive 25 is used. The thermally conductive adhesive 25 may be in paste or tape form. When the thermally conductive adhesive 25 in tape form is used, it may be previously attached to the heat spreader 27. The heat spreader 27 may be formed with the same outline as that of the stiffener 28 as shown in FIG. 8, or it may have a shape different from that of the stiffener 28. Since the heat spreader 27 is attached as required depending on the amount of heat produced by the semiconductor chip 16, it may be omitted if the amount of heat produced is low.

A product name or the like may be marked on the heat spreader 27 as required. If the heat spreader 27 is omitted, marking may be provided on the stiffener 28.

Figure 5:
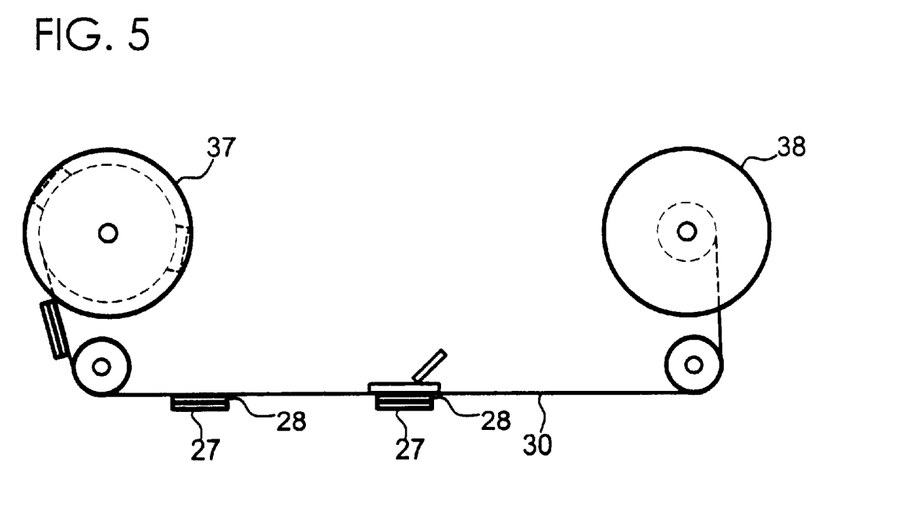
FIG. 5 is a diagram illustrating a bump forming process in the embodiment of the semiconductor device fabrication method according to the present invention.

Then, as shown in FIG. 5, the reel 37 having the film carrier tape 30 wound thereon is set on another fabrication equipment. The film carrier tape 30 is rolled out and placed between the reels 37 and 38, and the bumps 14 are formed on each semiconductor chip 16. Note that FIGS. 6A to 6C show a process of forming the bumps 14.

As shown in FIG. 6A, a metal mask 50 is disposed on the land 21 side of the film carrier tape 30 (see FIG. 1B) so that an opening 50a of the metal mask 50 is positioned on each land 21. Then, cream solder 52 is put on the metal mask 50, and the opening 50a of the metal mask 50 is filled with the cream solder 52 by means of a squeegee 54. Subsequently, as shown in FIG. 6B, the cream solder 52 filled in each opening 50a is irradiated with a laser beam to be melted into a ball shape due to surface tension, and then it is cooled. As shown in FIG. 6C, all lumps of the cream solder 52 on the openings 50a are formed to have a ball shape in this manner, whereby the bumps 14 are formed as shown in FIG. 8.

Then, after the film carrier tape 30 is taken up by the reel 38, the reel 38 is set on another fabrication equipment as shown in FIG. 7. The film carrier tape 30 is rolled out and placed between the reels 38 and 39, and then the film carrier tape 30 is punched into separate pieces of insulating film 12. Before this punching process, the film carrier tape 30 may be cleaned. The semiconductor device 10 as shown in FIG. 8 can thus be attained.

Since the semiconductor device 10 can be fabricated through a series of steps in a reel-to-reel style operation as mentioned above, productivity can be increased to allow mass-production while reducing the cost of manufacturing.

After the above-mentioned processes, chip mounting conditions, electrical characteristics, and the like of each insulating film 12 are inspected to finish a semiconductor device product.

The present invention is not limited in its application to the above-mentioned embodiments and various changes and modifications may be made therein. For example, instead of the foregoing embodiment in which the film carrier tape 30 is taken up by a reel at each step, a series or plurality of steps may be carried out in the same reel-to-reel operation. In the step shown in FIG. 3, for instance, the process of attaching the stiffener 28 may be followed by the process of attaching the heat spreader 27 shown in FIG. 4 between the reels 35 and 36. Alternatively, a reinforcing member having an integrated form of the stiffener 28 and the heat spreader 27 may be attached to the film carrier tape 30.

Further, the present invention is applicable to a front-TAB type in which the semiconductor chip 16 is mounted on the side on which the bumps 14 are formed, as well as a back-TAB type in which the semiconductor chip 16 is mounted on the side opposite to the side on which the bumps 14 are formed as shown in FIG. 8. Furthermore, a B-TAB type of insulating film having integrally formed bumps on the leads 20 may be used instead of the insulating film 12. Still further, single-point bonding may be carried out by using a film carrier tape having no bumps.

Figure 9:
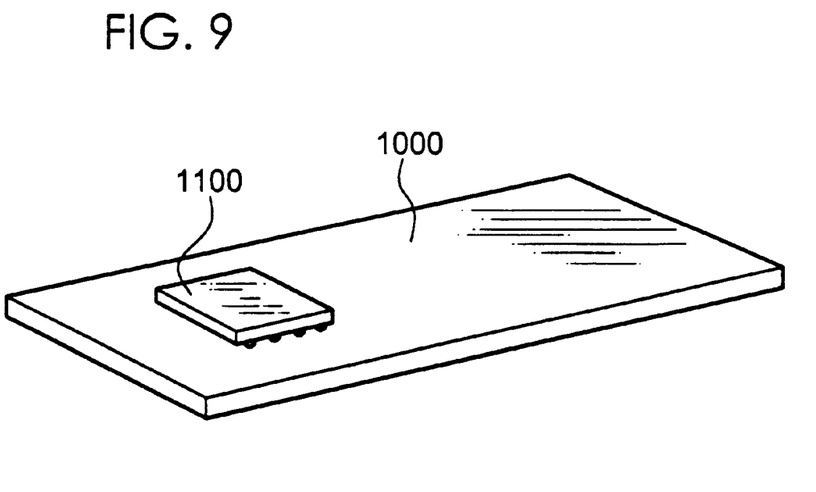
FIG. 9 is a diagram showing the embodiment of the circuit board according to the present invention.

FIG. 9 shows a circuit board 1000 on which a semiconductor device 1100 fabricated according to the present invention is mounted. It is common practice to use a circuit board made of organic resin such as glass epoxy resin, for example. On the circuit board, wiring patterns made of copper or the like are formed to form the desired circuits, and bumps of the semiconductor device are physically connected with these wiring patterns to provide electrical continuity.

Figure 10:
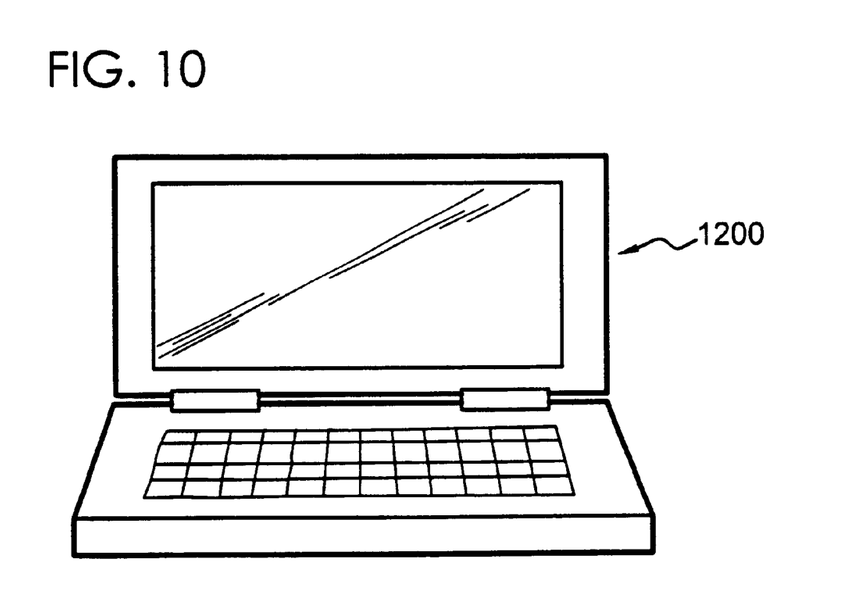
FIG. 10 is a diagram showing an electronic apparatus including a circuit board on which is mounted the semiconductor device fabricated according to the method of the present invention.

FIG. 10 shows a notebook-type personal computer 1200 as an electronic apparatus equipped with the circuit board 1000.

In addition, by applying the present invention described above, it is also possible to fabricate surface-mounting-type electronic components (either active or passive parts) having a plurality of bumps as in semiconductor devices, for example, such electronic components as resistors, capacitors, coils, oscillators, filters, temperature sensors, thermistors, varistors, variable resistors, and fuses.

What is claimed is:

1. A method of fabricating semiconductor devices comprising the steps of:

mounting a plurality of semiconductor chips on a film carrier tape;

attaching an individual reinforcing member to said film carrier tape at a position corresponding to each one of said semiconductor chips after mounting said semiconductor chips on said film carrier tape;

forming a plurality of external electrodes on said film carrier tape at a position corresponding to each one of said semiconductor chips after attaching said individual reinforcing member to said film carrier tape; and punching out said film carrier tape in to separate film packages after forming the plurality of external electrodes on said film carrier tape;

wherein each of said steps is carried out on said film carrier tape running between supply and take-up reels.

2. The method of fabricating semiconductor devices as defined in claim 1, further comprising a step of bonding a heat spreading member to each one of said semiconductor chips before the step of punching out said film carrier tape.

3. A semiconductor device fabricated by using the method as defined in claim 2.

4. A circuit board comprising the semiconductor device as defined in claim 3.

5. An electronic apparatus comprising the semiconductor device as defined in claim 3.

6. A semiconductor device fabricated by using the method as defined in claim 1.

7. A circuit board comprising the semiconductor device as defined in claim 6.

8. An electronic apparatus comprising the semiconductor device as defined in claim 6.

* * * * *